United States Patent [19]

Sanderson

[11] 4,020,318

[45] Apr. 26, 1977

[54] ELECTRON BEAM GENERATORS

[75] Inventor: Allan Sanderson, Balsham, England

[73] Assignee: The Welding Institute, Abington, England

[22] Filed: Jan. 24, 1975

[21] Appl. No.: 544,009

[52] U.S. Cl. .................................. 219/121 EB
[51] Int. Cl.$^2$ ............................. B23K 9/00
[58] Field of Search ............ 219/121 EB, 121 EM; 250/492, 310; 313/337, 346 R, 336

[56] References Cited

UNITED STATES PATENTS

| | | | |
|---|---|---|---|
| 3,193,722 | 7/1965 | Opitz | 219/121 EB X |
| 3,251,536 | 5/1966 | Connor | 219/121 EB X |
| 3,413,517 | 11/1968 | Barber et al. | 219/121 EB X |
| 3,497,666 | 2/1970 | Hansen | 219/121 EB |
| 3,760,279 | 9/1973 | Rudolph | 219/121 EB X |
| 3,761,676 | 9/1973 | McFarland et al. | 219/121 EB |
| 3,878,424 | 4/1975 | Suganuma | 313/337 |
| 3,909,662 | 9/1975 | Thomas et al. | 315/106 |
| 3,909,663 | 9/1975 | Thomas et al. | 315/106 |

*Primary Examiner*—J. V. Truhe
*Assistant Examiner*—Fred E. Bell
*Attorney, Agent, or Firm*—Cushman, Darby & Cushman

[57] ABSTRACT

This concerns an electron beam generator system in which the supply for at least one auxiliary electrode of the electron gun (for example the filament or biasing electrode) is provided by a high frequency oscillator connected to a transformer or other coupling means, the output of which is applied at the electron beam gun column to a component which is itself connected to the output of the high voltage generator; this dispenses with the superimposition of the auxiliary supply on the HT voltage at a remote high voltage generator and with the corresponding auxiliary supply conductor in the conventional high voltage cable between the high voltage generator and the electron beam gun column.

16 Claims, 8 Drawing Figures

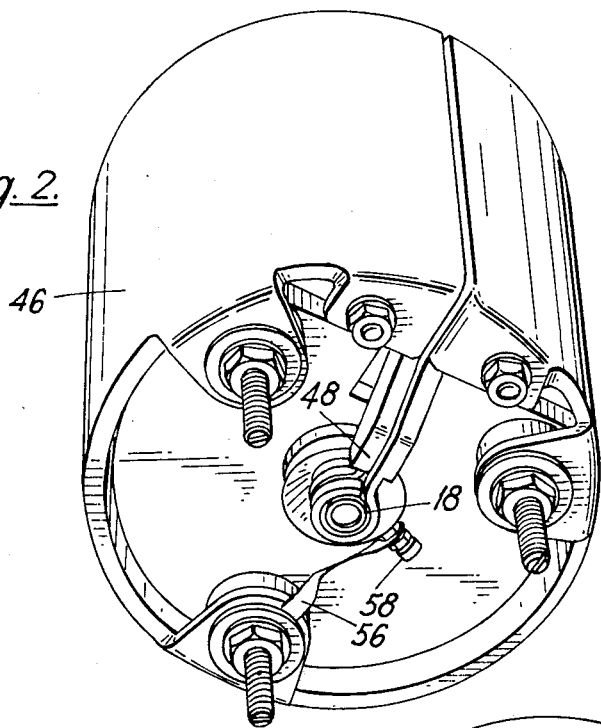
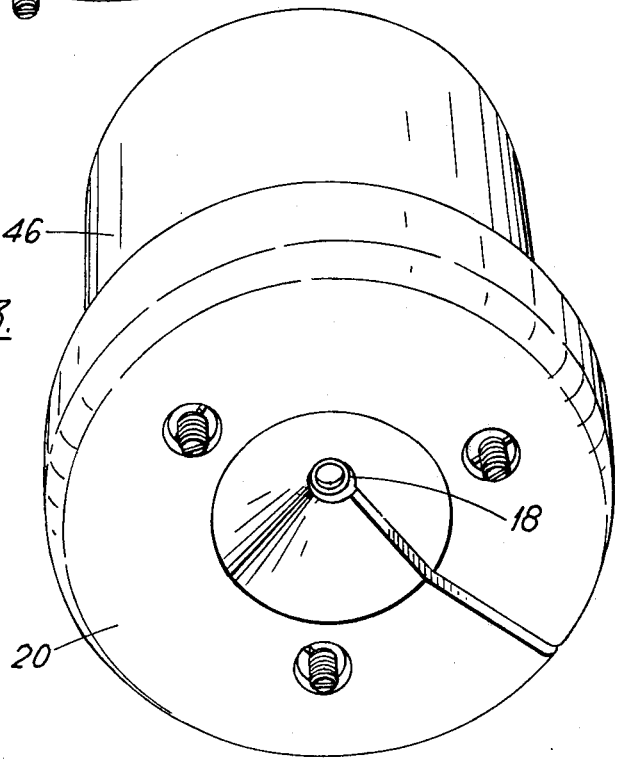

ELECTRON BEAM GENERATORS

In electron beam welding, an electron gun produces a stream of electrons which is accelerated and focussed on to a workpiece. Electron beam welding is extremely advantageous where deep penetration and a narrow heat-affected zone is required but an electron beam generator requires a very high voltage; voltages of 30 kV are typical and even 150 kV is used in many installations. Furthermore, because it is the cathode which is maintained at this high voltage with respect to earth, the filament and control electrode supplies must be superimposed on the high-voltage supply, and operate at this high voltage with respect to earth.

It is generally desirable to be able to move the electron beam generator and consequently it is connected by cable to a fixed generating system at which the high-voltage cathode, filament and control electrode supplies are generated. Typically, these supplies pass through a three-core cable; two of these cores may have to supply a filament current of perhaps 50 amps and must therefore be much larger than the core which provides the high voltage for the cathode. One of the cores supplying the filament current also supplies the biasing voltage for the control electrode. All three conductors are at a very high voltage with respect to earth and as a consequence the cable is of large diameter and is not very flexible. Such a cable is expensive and the sockets and terminations for the cores are bulky and cost considerably more than the cable itself.

In an electron beam generator system according to the present invention with a high-voltage generator connected to the cathode of an electron beam gun column, the system further comprises, for providing an auxiliary voltage supply for the electron gun of the electron beam gun column, an oscillator supplying an alternating voltage of at least 2 kHz to a coupling means, the output of the coupling means being applied at the electron beam gun column to a component which is itself connected to the output of the high voltage generator and being used to supply an auxiliary electrode of the electron gun. By "auxiliary voltage supply," we mean for example a voltage supply for the control electrode of the electron gun or for a directly heated or indirectly heated cathode of the electron gun. The coupling means may be a coil or transformer or in some cases it may be a waveguide. If desired, both the bias supply and the cathode heating supply may be superimposed on the HT voltage at the electron beam generator and in such a case the cable connecting the high voltage system to the electron beam generator may have a single core carrying only a very small current, although at the high voltage. With the omission of the cores carrying the cathode-heating current, the cable becomes much more flexible, smaller in diameter, and less costly. In addition, less high-voltage feedthrough connectors are required when the auxiliary voltage is superimposed locally, i.e., at the electron beam generator, on to the high voltage which reaches the generator through the high voltage cable.

An additional advantage of locally superimposing the biasing voltage on the HT voltage is that it facilitates a faster response of the beam generating system to required changes. With a long high voltage cable between the biasing voltage supply and the electron beam generator, control of the biasing voltage can be effected by means of a rotary autotransformer on the primary side of a bias-supply isolation transformer but if this transformer is supplied with mains frequency, this form of control is rather slow-acting due to the necessity of having a large smoothing capacitor to reduce ripple. In fact, it may require a time period of several cycles before a change of the primary supply takes effect. This lag can be reduced by increasing the frequency of the voltage supplied to the autotransformer to 5 kHz, for example, and reducing the smoothing capacitance inversely in proportion; however, the capacitance of the high voltage cable itself imposes a limitation on the usefulness of increasing the supply frequency. Thus, it is not possible to shorten the effective time period for change in the final bias voltage below a lower limit which is typically 1 millisecond.

However, when the bias supply is superimposed on the HT voltage at the electron beam generator, it can be generated close to the electron beam generator by means of an oscillator which can operate at a frequency of, for example, 100 kHz or 3 MHz; the capacitance to be driven is only that of the bias electrode with respect to the gun, plus the relatively small capacitance of the conductors connecting the bias supply to the gun. This is only a small fraction of the capacitance of a three-core high voltage cable which may be several hundred picofarads per yard. Consequently, a rapid response can be obtained when a bias variation is required, so that it becomes practicable to pulse or modulate the bias electrode at high frequencies, such as 10 kHz.

A further advantage of the elimination of the long supply cable is that in the case of a flashover from bias electrode to casing, the potential of the gun structure as a whole follows the reduction of the HT voltage making insulation breakdown of the internal bias supply circuitry much less likely.

In one arrangement employing an annular or circular cathode, a high frequency current is induced in the cathode from a surrounding coil, this current heating the cathode to the required temperature.

If desired, the HT voltage for the cathode may also be generated in the vicinity of the electron beam gun column.

For high voltage electron beam generators, if the coupling means includes a transformer the coils comprising the transformer for the relevant supply may be coupled through the vacuum of the tube. If the primary coil is outside the column enclosure and the enclosure is conducting, it may be necessary to leave a non-conducting slit in the enclosure to permit such coupling. The secondary coil may be arranged inside the bias cup or, if desired, in the corona ring; again, a slit may be left in the cup or ring to permit coupling of the primary coil to the secondary coil.

In installations of lower accelerating voltage for example in a 30 kV electron beam generator, it is possible to couple the coils through an insulating ferromagnetic material such as a ferrite rod or core.

In order that the invention may be better understood, some examples of apparatus embodying the invention will now be described with reference to the accompanying drawings, in which:

FIG. 2 shows a part of the cathode heating assembly, with the bias electrode removed;

FIG. 3 shows the assembly of FIG. 2 with the bias electrode in place;

Figure 1:
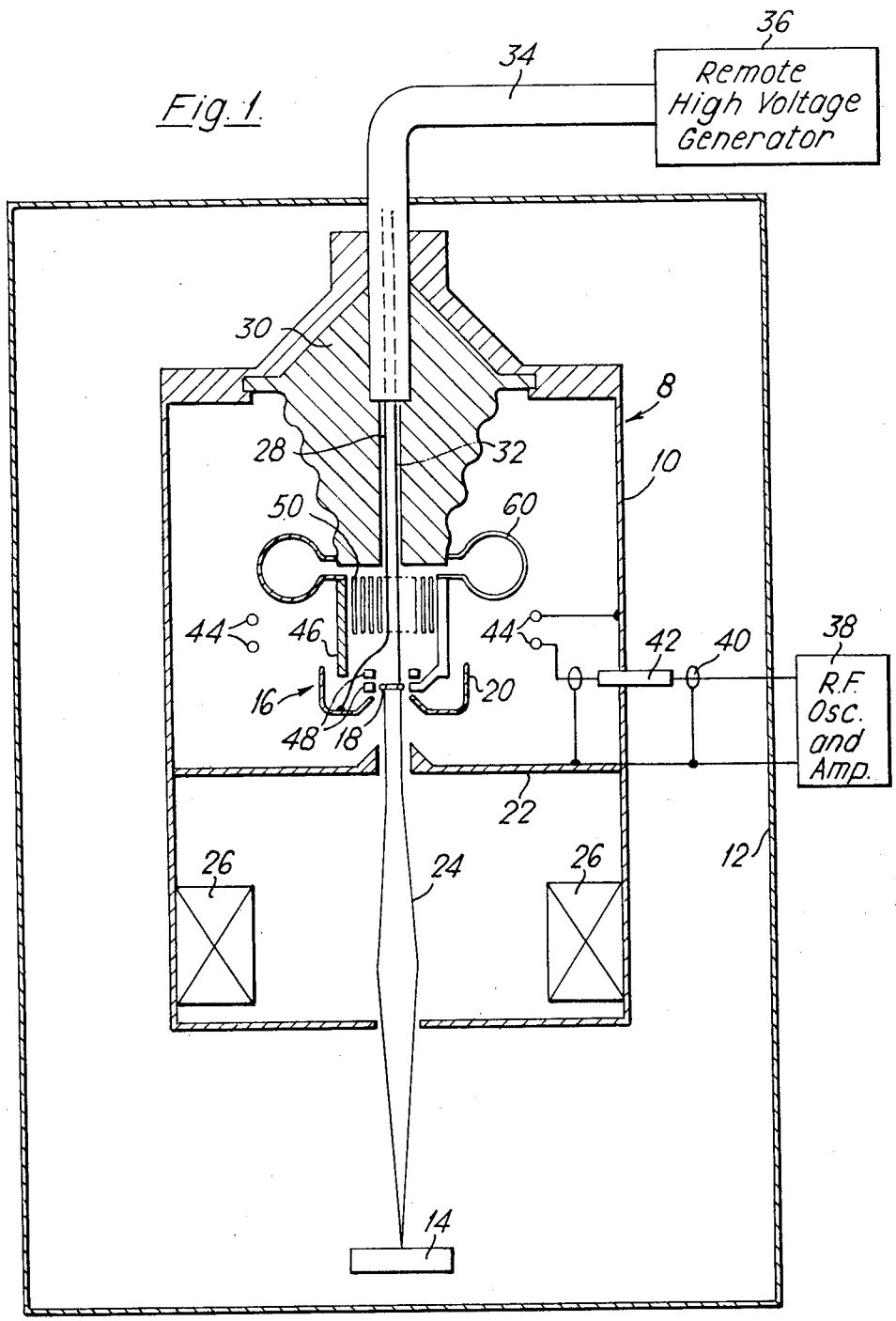
FIG. 1 illustrates an electron beam generating system in which the cathode heating current is induced in the cathode, which is itself connected to the HT voltage supply.

In the apparatus shown in FIG. 1, an electron beam generator column 8 in a metal enclosure 10 is housed in a vacuum chamber 12 in which is placed a workpiece 14 to be treated. The beam generator column contains an electron gun 16 comprising an annular cathode 18, a biasing electrode 20 and an anode 22. The gun generates a beam 24 which is accelerated by the anode 22 and is focussed by focussing coils 26.

HT voltage is supplied to the cathode by way of a conductor 28 which passes through an insulator 30 at the top of the column. In the column shown, a bias voltage is applied to the control electrode 20 by way of a conductor 32 which also passes through the insulator 30. Conductors 28 and 32 are both at a very high voltage and both pass through the high voltage cable 34 which, at its remote origin, is connected to a high voltage generator 36.

Figure 4:
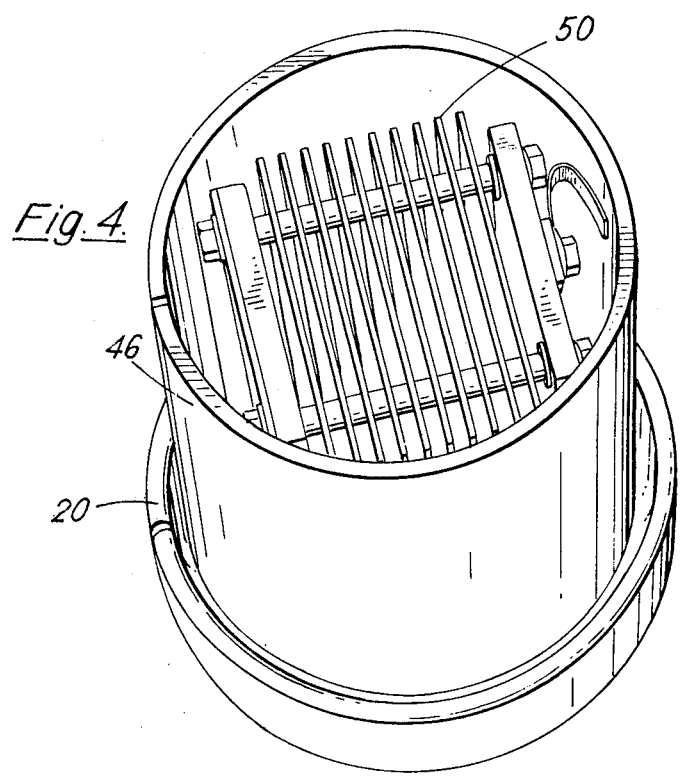
FIG. 4 is a view of the assembly showing the tuning capacitor inside the single-coil.

In the apparatus shown in FIG. 1, the supply for the heating of the cathode is not superimposed on the HT voltage at the remote generator 36, as is conventional, but instead is induced in the cathode in the electron gun. The cathode heating supply is derived from an RF oscillator and amplifier 38 which generates a voltage at a frequency of 40 MHz. The RF signal is applied by way of cable 40 to a lead-through insulator 42 in the wall of the electron beam generator column and thence to a two-turn driving coil 44. Current passing through the coil 44 induces a current in the single-turn coil 46 (see also FIGS. 2, 3 and 4), the lower end of which is connected to a two-turn coil 48 immediately surrounding the cathode 18. A tuning capacitor 50 is connected across the single-turn coil 46 and therefore also across the two-turn coil 48. A corona ring 60 is mounted at the top of the coil 46.

Figure 5:
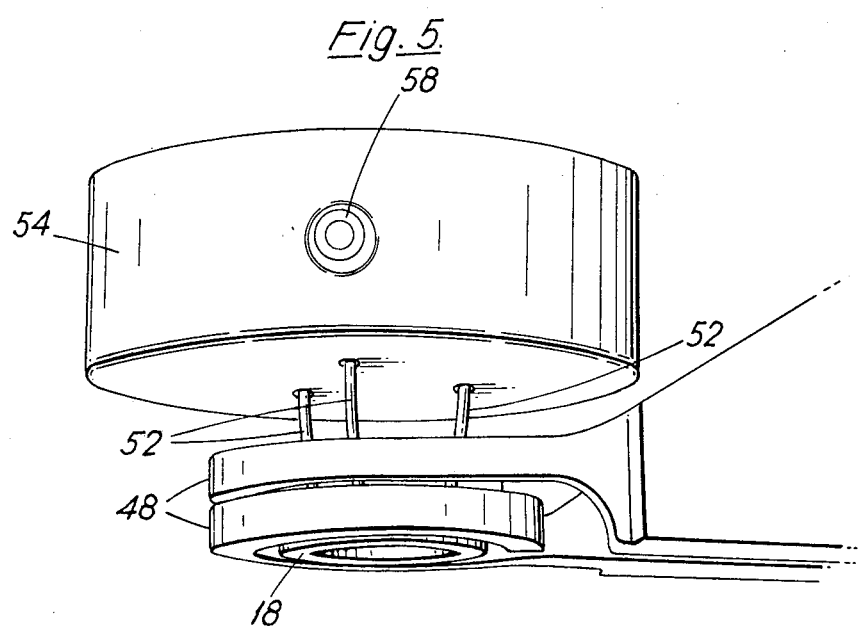
FIG. 5 shows the manner in which the cathode is mounted and the HT connection to the cathode.

As shown in FIG. 5 the annular cathode 18 is connected by three legs 52 to a base 54. The high voltage is conveyed to the cathode through a connector 56 (FIG. 2), a bolt 58 and the three legs 52.

It will be seen from the above description that the heating of the cathode is carried out by generating an RF current and passing it through the two-turn coil 44, inducing a current in the single-turn coil 46, which forms a tuned circuit with the capacitor 50, and applying this current to the two-turn coil 48. Current circulating in the coil 48 induces an RF current in the cathode which is consequently heated. The coils 44, 46 and 48 constitute a coupling means coupling the output of the oscillator to the cathode of the electron gun.

The cathode is preferably of tantalum, although tungsten or any other suitable cathode material can be used. An annular cathode is useful for providing a hollow beam, which is very desirable in some cases. A further advantage of the method of heating shown is that the magnetic field due to circulating currents has less influence on the electrons from the cathode than the field from a directly heated filament. A ribbon electrode formed as a V with a flat bottom and carrying, for example, 40 amps, creates a circular field around its flat bottom, the field passing through the V and below it. This field tends to deflect the electrons away from the axis. The field due to current flowing around the annular cathode, on the other hand, is in the right direction for reducing electron deflection to a minimum, as is the field from the coils supplying the cathode and the field created by the cathode itself. In addition, the method of cathode heating shown permits the cathode to be lightly supported.

If desired, the cathode may be in the form of a disc or button instead of the annulus shown. The current will tend to flow in a circle in the plane of the emission surface due to the skin effect.

Although the indirect method of heating the cathode is preferred, direct heating can also be used; for example, the coil 46 can be connected in series with a ribbon filament.

Figure 6:
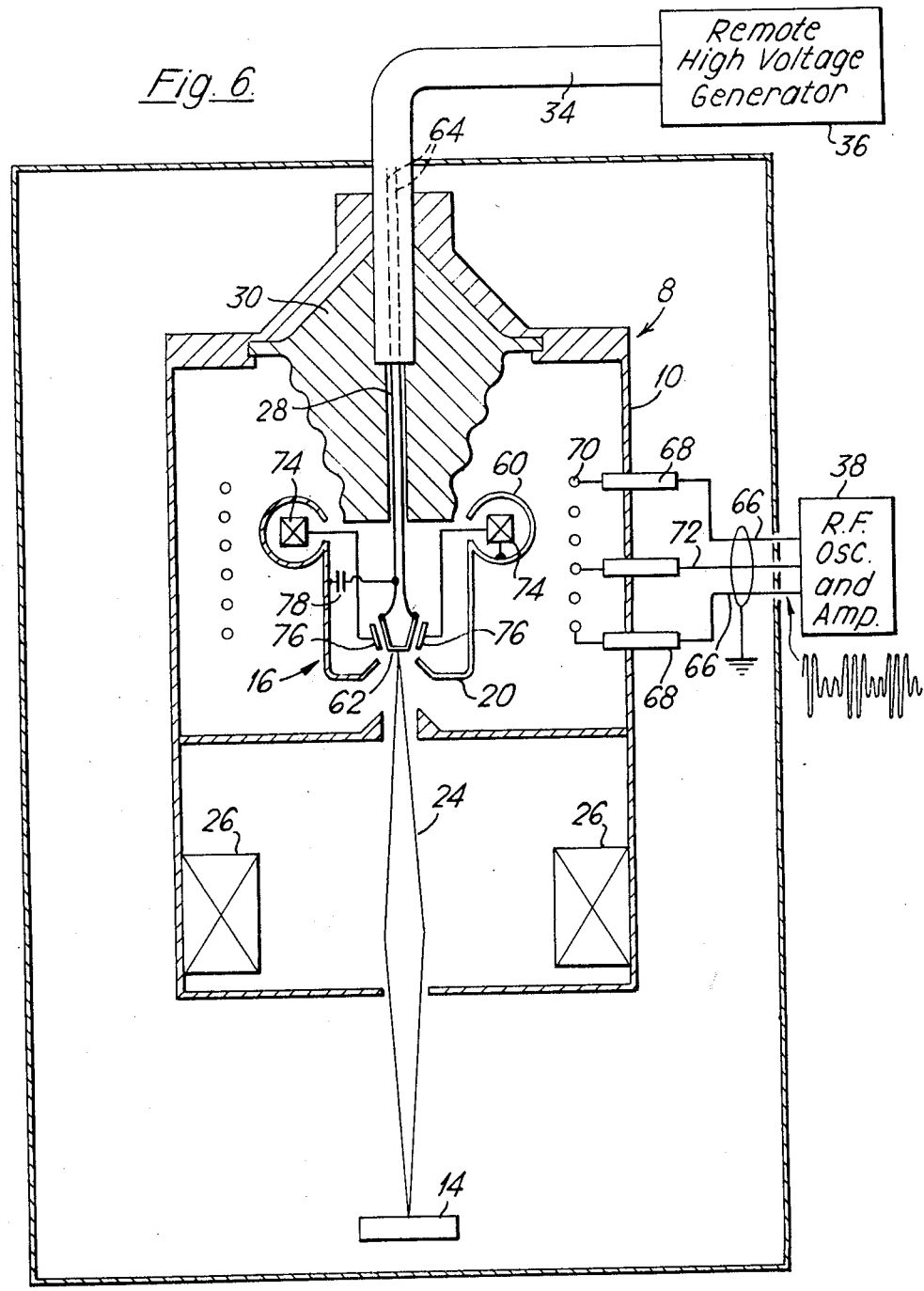
FIG. 6 illustrates an electron beam generator system in which the bias supply is superimposed at the electron beam generator on the HT voltage.

FIG. 6 shows an electron beam generator in which the filament is directly heated from a supply passing through the HT cable and the bias voltage is superimposed at the electron beam generator on the HT voltage, thereby permitting a faster response. The electron beam generator shown in FIG. 6 has a V-shaped filament ribbon 62 supplied by a pair of conductors 64, which are connected at the generator 36 to the high voltage source and serve to supply the high voltage to the filament. The high voltage cable 28 and the filament current cable 64 pass through the high voltage cable 34 to the remote high voltage generator 36.

In FIG. 6, an RF oscillator and amplifier 38, operating at a frequency of 80 kHz generates an RF oscillatory voltage which is applied over lines 66 and through lead-through insulators 68 to a multi-turn coil 70 within the electron beam generator enclosure. In FIG. 6, the output of the RF oscillator and amplifier is shown as a pulse-modulated alternating waveform; the pulsing frequency may be 10 kHz, for example. A further conductor 72 extends through the cable to a centre tapping on the coil 70. The coil 70 constitutes the primary winding of a transformer, the secondary winding 74 of which is housed in the corona ring 60, which is formed with a slit. The centre tapping of the coil 74 is electrically connected to the corona ring, which in turn is connected to the control electrode 20.

It would be possible to connect the output of the secondary winding to a soild-state rectifier bridge, housed within the electron beam gun column. However, solidstate rectifiers constitute additional components and are potentially a source of trouble due to high voltage transients, and in the form of apparatus shown in FIG. 6, such rectifiers are dispensed with by making the filament of the electron beam generator serve as one electrode of each of two diodes. Each side of the V-shaped cathode 62 constitutes the cathode of a diode. Electrodes 76 opposite these sides of the ribbon provide the anodes of the diodes and are connected to opposite ends of the centre-tapped secondary winding 74. This arrangement constitutes a full-wave rectifier with a reservoir capacitor 78.

In FIG. 6, the coil 70 constitutes a coupling means to couple the output of the oscillator to the component 74 which, through the diodes formed by the plates 76 and the filament, is connected to the output of the high voltage generator.

Figure 8:
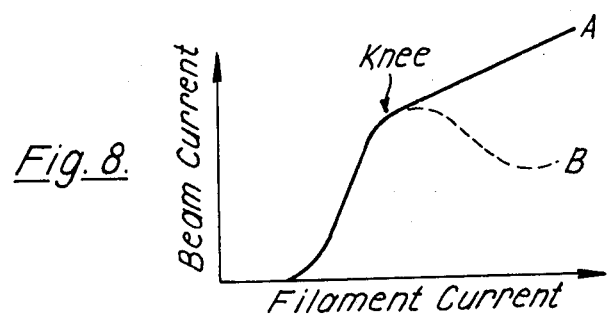
FIG. 8 is a graph illustrating an advantage of apparatus of the kind shown in FIGS. 6 and 7.

An advantage which springs from the diode arrangement shown is that it facilitates the so-called "peaking" of the beam current with change of filament current. With a conventional arrangement with a fixed bias voltage there is no beam current until the filament temperature due to the filament heating current reaches a predetermined value, (FIG. 8, Curve A) after which the beam current rises rapidly with filament current and then reaches a "knee," after which it rises at a less rapid rate. The procedure of determining the filament current at which the knee occurs is known as "peaking" the filament. It is desirable to work just above the knee because below the knee small changes in filament current result in large changes in beam current and it is undesirable to work higher above the knee than is necessary because at a greater filament current than necessary, the filament will deteriorate more quickly. With the cathode-diode arrangement described above, the legs of the filament will be held by clamps and will be cooler than the remainder of the cathode. When parts of the filament are used as diode electrodes the beam-current characteristic changes. If the cooler parts of the filament constitute the diode electrodes, the change in characteristic which occurs at the knee is such that with filament currents greater than that at the knee portion the beam current reduces with increases in filament current. The reason for this is that the diodes work with better efficiency when the filament legs are more fully heated and provide greater negative voltage for the biasing electrode. This new characteristic makes it much easier to set the optimum working filament current because with increase of filament current the beam current reaches a distinct peak and then decreases again, as indicated in curve B, FIG. 8.

For a 150 kV electron beam system, one particular configuration of coils for generating the bias or grid supply consists of a 38-turn single-layer primary coil of 32 cm. diameter and 7 cm. long. Inside this coil is positioned a 300-turn multi-layer secondary coil of 20 cm. inside diameter, 26 cm. outside diameter and 0.75 cm. long. The supply frequency in this case is 80 kHz.

The electron beam generator can be used with a locally applied biasing supply and a filament supply which is superimposed on the HT supply at the remote high voltage generator, or with a locally applied filament supply and a remotely superimposed biasing supply, or with both biasing and filament supplies locally applied to the appropriate components at the HT voltage. In the latter case, the only supply that has to be brought from the high voltage generator is the high voltage supply for the cathode. Although this may be at a voltage of 150 kV, the current required is only about 0.5 amperes even for a power level of 75 kV and consequently a thin conductor will suffice in the cable and the problems of terminating the cable are less severe.

Figure 7:
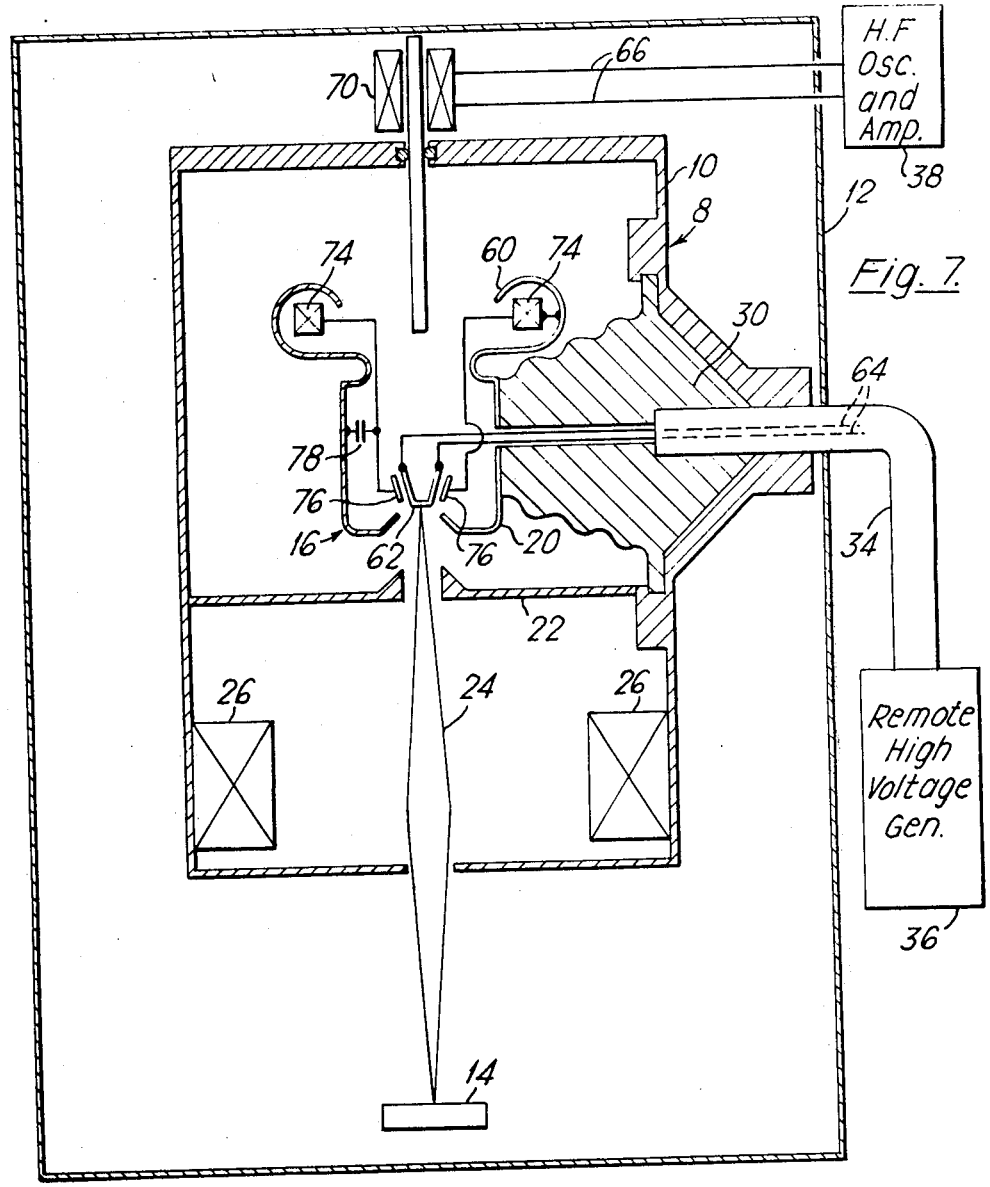
FIG. 7 illustrates an electron beam generator system operating at lower voltages than those shown in FIGS. 1 and 6 in which the bias supply is superimposed on the HT voltage at the electron beam generator and is derived through a transformer employing a ferrite core.

FIG. 7 shows an electron beam generator which is in many respects similar to FIG. 6 but which is designed for operation at a lower voltage, for example 30 kV. In this assembly, conductors connected to the main HT cable enter through the side of the electron beam generator enclosure and pass through an insulator 30. The primary coil 70 of the apparatus for generating the bias supply is in this case located at the top of the electron beam generator column and is coupled through a ferrite rod 80 to the secondary coil 74 located in the corona ring 60. Again, the bias supply may be pulse modulated. The primary coil is at earth potential with respect to the accelerating voltage supply of the electron gun, whereas the secondary coil is positioned within the high voltage region of the gun assembly. The enclosure wall surrounding the ferrite rod is either made from an insulating material or is a metallic material with at least one radial slit to reduce shunting of the high frequency supply. If desired, the primary coil 70 could also be located within the electron beam generator enclosure 10. The coil 70 and the ferrite rod 80 constitute the means for coupling the oscillator output to the coil component 74, which is connected through the diodes and filament to the high voltage supply.

The voltage across the terminals of the primary and secondary coils can be increased by connecting in parallel with each individual coil a tuning capacitor.

In addition to filament and grid supplies, any other auxiliary supplies required at the high voltage level can be generated in a similar manner. For example, the additional supply necessary to heat a cathode by rear bombardment with an electron beam can be derived in this way, thus eliminating the need for extra leads in the high voltage cable. This can be done, for example, by connecting a secondary coil of a transformer in series with a diode between the cathode to be heated and a filament, the primary of the transformer being energised from a high frequency supply as described above. The secondary coil may generate a voltage of, for example, 5 kV, the diode being connected to make the cathode positive with respect to the filament.

By an extension of this principle, in work-accelerated electron beam generators, a secondary coil in series with a diode may be connected between the filament or cathode of an electron gun and the workpiece. Again, the primary coil is energised at a high frequency in the manner described with reference to FIGS. 1, 6 and 7. By a further extension of this principle, a series-connected secondary coil and diode may be connected between a cathode or other components substantially at cathode potential, and an anode, which may be the first of a series of anodes. A further series-connected secondary coil and diode may be connected between this first anode and a second anode, and so on, the anodes being spaced along the electron gun column to form a gradient gun. Each secondary coil is energised from a primary coil connected to a high frequency supply. The secondary coils are preferably placed in corona rings.

If the high voltage is generated locally in this way, the high voltage cable connection and the remote high voltage generator are dispensed with and the electron beam generator system becomes more compact and more convenient to use. As emphasized above, even the removal of the filament current leads from the high voltage cable is a considerable advantage in that it permits a much lighter and more flexible cable to be used, and if the bias supply is also generated near the electron gun column from a high frequency source a faster response to modulation or other changes is obtained. The frequency of the oscillator in a system embodying the invention should be at least 2 kHz. It is desirable that it is at least 10 kHz, preferably over 100 kHz.

I claim:
1. An electron beam generator system comprising a high voltage generator, an electron beam gun column having a longitudinal axis along which an emitted electron beam is directed, an oscillator for supplying an alternating voltage at a frequency of at least 2 kHz, an inductive coupling means connected to receive the output of the oscillator and comprising a primary coil and a secondary coil, at least the secondary coil being arranged concentrically around the electron beam gun column, the gun column including a cathode connected to the high voltage generator and the coupling means including an output coil so situated with respect to the cathode that when the output coil is energized by a high frequency current, a high frequency current is induced in the cathode and heats the cathode.

2. An electron beam generator system in accordance with claim 1, in which the said output coil is connected to a single-turn coil of larger diameter than said output coil and surrounding the latter, the single-turn coil comprising said secondary coil.

3. An electron beam generator system in accordance with claim 2, including a tuning capacitor connected across the said single-turn coil.

4. An electron beam generator system in accordance with claim 3, in which the tuning capacitor is located within the single-turn coil.

5. An electron beam generator system in accordance with claim 1, in which the cathode is of annular form.

6. An electron beam generator system in accordance with claim 1 in which the said primary coil of the coupling means is supplied with a pulsed carrier wave, the pulsing providing a modulation of the bias applied to the biasing electrode.

7. An electron beam generator system comprising a high voltage generator, an electron beam gun column having a longitudinal axis along which an emitted electron beam is directed, an oscillator for supplying an alternating voltage at a frequency of at least 2 kHz, an inductive coupling means connected to receive the oscillator output and including a primary coil and a secondary coil, at least the secondary coil being arranged concentrically around the electron beam gun column, and an electrode of the electron beam gun column connected to receive the output of the high volage generator and arranged to receive the output of the said secondary coil superimposed on the said high voltage generator output.

8. An electron beam generator system in accordance with claim 7, in which the frequency of the oscillator output is at least 100 KHz.

9. An electron beam generator system comprising a high voltage generator, an electron beam gun column having a longitudinal axis along which an emitted electron beam is directed, an oscillator for supplying an alternating voltage at a frequency of at least 2 kHz, an inductive coupling means connected to receive the output of the oscillator and including a primary coil and a secondary coil, at least the secondary coil being arranged concentrically around the electron beam gun column, and in which the secondary coil is connected through a rectifier circuit to the output of the high voltage generator, the electron beam gun column including a biasing electrode connected to the said secondary coil and rectifier to receive therefrom a biasing voltage superimposed on the output of thhe high voltage generator.

10. An electron beam generator system in accordance with claim 9, in which the said secondary coil is located in a corona ring of the electron beam gun column.

11. An electron beam generator system in accordance with claim 9 in which the cathode of the electron gun is a filament, two separate portions of which serve as the cathodes of diodes, the anodes of which are constituted by two electrodes respectively spaced from the two cathode portions of the filament, the diodes being connected to the said secondary coil in a full-wave rectifier circuit.

12. An electron beam generator system in accordance with claim 11, in which ends of the said filament adjacent the said cathode portions are held in clamps, the said clamps tending to cool the said cathode portions, whereby a nonlinearity in the beam current-filament current characteristic is accentuated and adjustment of the beam current is facilitated.

13. An electron beam generator system comprising a high voltage generator, an electron beam gun column having a longitudinal axis along which an emitted electron beam is directed and including a component at cathode potential and an anode, an oscillator for supplying an alternating voltage at a frequency of at least 2 kHz, an inductive coupling means connected to receive the oscillator output and including a primary coil and a secondary coil, at least the secondary coil being arranged concentrically around the electron beam gun column, the secondary coil being connected in series with a rectifier between the said cathode-potential component and the anode of the electron gun, whereby the anode voltage is generated at the electron gun beam column.

14. An electron beam generator system in accordance with claim 13, in which the said anode is the first of a series of anodes spaced along the electron beam gun column and in which between each pair of successive anodes there is connected a coil and rectifier circuit, each coil being inductively coupled to a further coil connected to receive the output of an oscillator supplying an alternating voltage of at least 2 kHz, whereby successive anodes have progressively greater voltages with respect to the cathode.

15. An electrode beam generator system comprising a high voltage generator, an electron beam gun column having a longitudinal axis along which an emitted electron beam is directed, an oscillator for supplying an alternating voltage at a frequency of at least 2 kHz, an inductive coupling means connected to receive the oscillator output and including a primary coil and a secondary coil, at least the secondary coil being arranged concentrically around the electron beam gun column, in which the electron beam gun column includes a cathode connected to the output of the high voltage generator and indirectly heated by a filament and in which the output of the said secondary coil is connected in series with a rectifier between the filament and the cathode.

16. An electron beam generator system of the work-accelerated kind comprising a high voltage generator, an electron beam gun column having a longitudinal axis along which an emitted electron beam is directed, an oscillator for supplying an alternating voltage at a frequency of at least 2 kHz, an inductive coupling means connected to receive the oscillator output and including a primary coil and a secondary coil, at least the secondary coil being arranged concentrically around the axis of the electron beam gun column, the secondary coil being connected in series with a rectifier between the cathode of the gun and the workpiece.

* * * * *